United States Patent
Navon et al.

(10) Patent No.: US 9,312,002 B2
(45) Date of Patent: Apr. 12, 2016

(54) METHODS FOR PROGRAMMING RERAM DEVICES

(71) Applicant: SanDisk Technologies Inc., Plano, TX (US)

(72) Inventors: Ariel Navon, Revava (IL); Idan Alrod, Herzliya (IL); Eran Sharon, Rishon Lezion (IL); Ishai Ilani, Dolev (IL); Tz-yi Liu, Palo Alto, CA (US); Tianhong Yan, Saratoga, CA (US); Gopinath Balakrishnan, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 107 days.

(21) Appl. No.: 14/245,194

(22) Filed: Apr. 4, 2014

(65) Prior Publication Data
US 2015/0287459 A1    Oct. 8, 2015

(51) Int. Cl.
*G11C 13/00*    (2006.01)

(52) U.S. Cl.
CPC ........ *G11C 13/0069* (2013.01); *G11C 13/0002* (2013.01)

(58) Field of Classification Search
CPC .................. G11C 13/0069; G11C 13/0002
See application file for complete search history.

(56) References Cited

U.S. PATENT DOCUMENTS

| | | |
|---|---|---|
| 5,579,261 A | 11/1996 | Radjy et al. |
| 5,650,966 A | 7/1997 | Cleveland et al. |
| 5,706,228 A | 1/1998 | Chang et al. |
| 5,889,702 A | 3/1999 | Gaultier et al. |
| 6,046,932 A | 4/2000 | Bill et al. |
| 6,240,023 B1 | 5/2001 | Roohparvar et al. |
| 6,275,415 B1 | 8/2001 | Haddad et al. |
| 6,385,090 B1 | 5/2002 | Kitazaki |
| 6,469,939 B1 | 10/2002 | Wang et al. |
| 6,574,145 B2 | 6/2003 | Kleveland et al. |
| 6,628,545 B1 | 9/2003 | Li et al. |
| 6,639,839 B1 | 10/2003 | Chou et al. |
| 6,909,638 B2 | 6/2005 | Choy et al. |
| 7,110,300 B2 | 9/2006 | Visconti |
| 7,161,844 B2 | 1/2007 | Sarin et al. |
| 7,215,583 B2 | 5/2007 | Chih et al. |

(Continued)

OTHER PUBLICATIONS

Dimin Niu et al., "Design Trade-Offs for Low-Power, High-Density Cross-Point Resistive Memory", International Symposium on Low Power Electronics and Design (ISLPED), Jul.-Aug. 2012, Redondo Beach, USA.

(Continued)

*Primary Examiner* — Khamdan Alrobaie
(74) *Attorney, Agent, or Firm* — Vierra Magen Marcus LLP

(57) ABSTRACT

A programming technique for a set of resistance-switching memory cells such as ReRAM cell involves programming the low resistance cells to the high resistance state (in a reset process) early in a programming operation, before programming the high resistance cells to the low resistance state (in a set process), to minimize losses due to leakage currents. The reset process can be performed in one or more phases. In some cases, a current limit is imposed which limits the number of cells which can be reset at the same time. Initially, the cells which are to be reset and set are identified by comparing a logical value of their current resistance state to a logical value of write data. If there is a match, the cell is not programmed. If there is not a match, the cell is programmed.

16 Claims, 11 Drawing Sheets

(56) References Cited

U.S. PATENT DOCUMENTS

| | | |
|---|---|---|
| 7,283,398 B1 | 10/2007 | He et al. |
| 7,295,471 B2 | 11/2007 | Hsieh et al. |
| 7,304,888 B2 | 12/2007 | Knall |
| 7,451,413 B1 | 11/2008 | Sutardja |
| 7,471,561 B2 | 12/2008 | Lin |
| 7,495,984 B2 | 2/2009 | Kim et al. |
| 7,504,695 B2 | 3/2009 | Martelloni et al. |
| 7,573,748 B2 | 8/2009 | Bedarida et al. |
| 7,586,787 B2 | 9/2009 | Vo et al. |
| 7,619,924 B2 | 11/2009 | Bollu |
| 7,630,253 B2 | 12/2009 | Melik-Martirosian et al. |
| 7,633,797 B2 | 12/2009 | Chen et al. |
| 7,672,155 B2 | 3/2010 | Kim et al. |
| 7,787,298 B2 | 8/2010 | Lin |
| 7,800,949 B2 | 9/2010 | Liao |
| 7,830,717 B2 | 11/2010 | Won et al. |
| 7,835,198 B2 | 11/2010 | Choi et al. |
| 7,848,146 B2 | 12/2010 | Suh et al. |
| 7,924,601 B2 | 4/2011 | Aoki |
| 7,961,498 B2 | 6/2011 | Khalil et al. |
| 8,208,337 B2 | 6/2012 | Liao |
| 8,270,240 B2 | 9/2012 | Lin et al. |
| 8,289,751 B2 | 10/2012 | Tian et al. |
| 8,344,346 B2 | 1/2013 | Baek et al. |
| 8,392,770 B2 | 3/2013 | Toda |
| 2007/0140029 A1 | 6/2007 | Kim et al. |
| 2007/0285057 A1 | 12/2007 | Yano |
| 2008/0056024 A1 | 3/2008 | Bollu et al. |
| 2008/0117676 A1 | 5/2008 | Lin |
| 2008/0165571 A1* | 7/2008 | Lung .............. G11C 11/5678 365/163 |
| 2008/0219061 A1 | 9/2008 | Choi et al. |
| 2009/0059663 A1 | 3/2009 | Lin |
| 2010/0073994 A1 | 3/2010 | Khalil et al. |
| 2011/0149671 A1 | 6/2011 | Liao |
| 2012/0026779 A1 | 2/2012 | Ikegami et al. |
| 2012/0147648 A1 | 6/2012 | Scheuerlein |
| 2012/0187995 A1 | 7/2012 | Gotoh |
| 2012/0230126 A1 | 9/2012 | Ramaraju et al. |
| 2012/0320700 A1 | 12/2012 | Lin et al. |

OTHER PUBLICATIONS

H. Hajimiri et al., "Content-aware encoding for improving energy efficiency in multi-level cell resistive random access memory," Nanoscale Architectures (NANOARCH), 2013 IEEE/ACM International Symposium on , vol., no., pp. 76,81, Jul. 15-17, 2013.

Cong Xu et al., "Design implications of memristor-based RRAM cross-point structures," Design, Automation & Test in Europe Conference & Exhibition (DATE), 2011 , vol., no., pp. 1,6, Mar. 14-18, 2011.

* cited by examiner

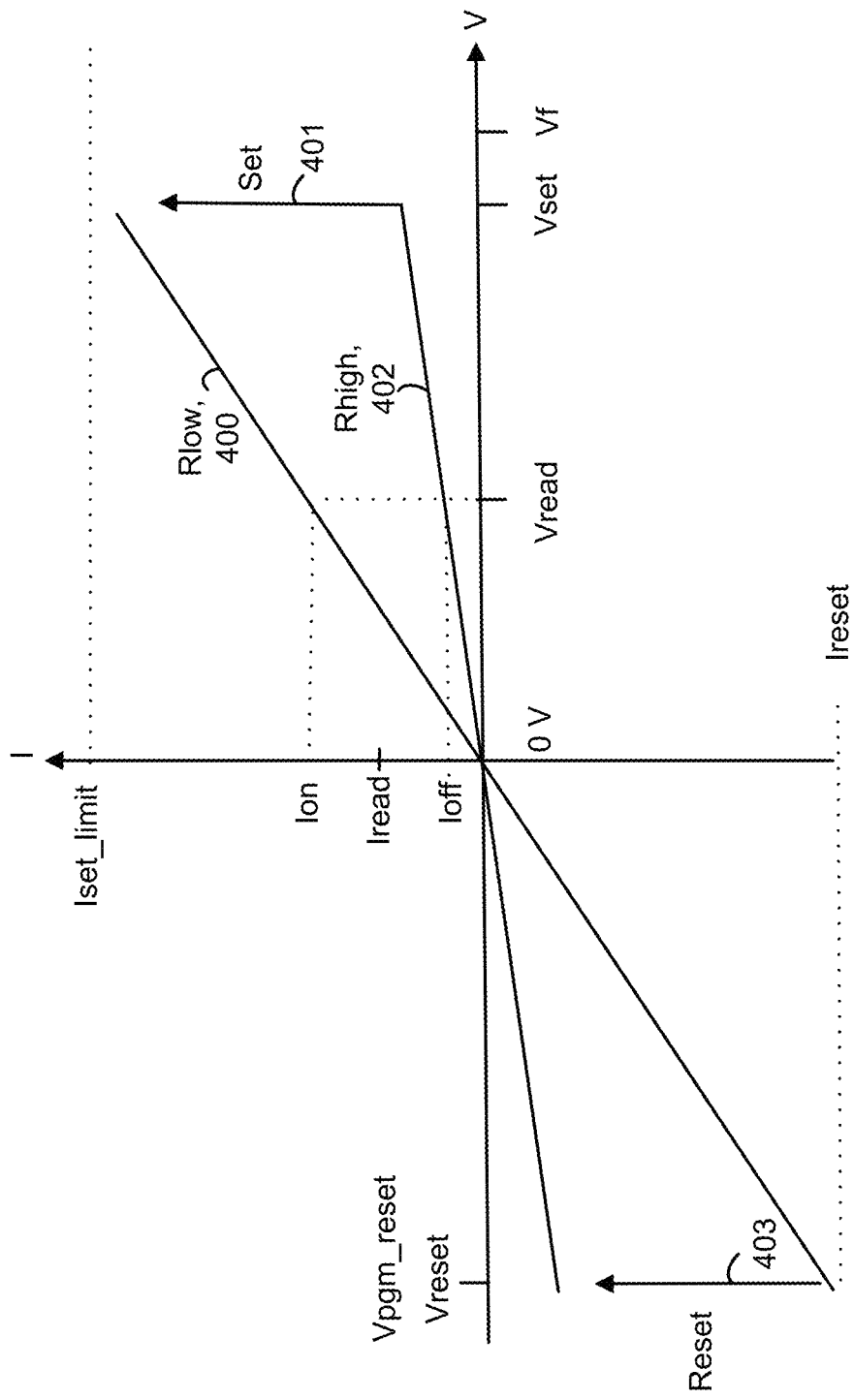

Fig. 6A

| Cell | State | Iprog | Is |
|---|---|---|---|
| MC7_0s | 0→1 | Iset | |
| MC6_0s | 0→1 | Iset | |
| MC5_0s | 0→1 | Iset | |
| MC4_0s | 0→1 | Iset | |
| MC3_0u | 0 | | Is_off |
| MC2_0u | 0 | | Is_off |
| MC1_0u | 0 | | Is_off |
| MC0_0u | 0 | | Is_off |
| | | | |
| MC7_1s | 1 | | Is_on |
| MC6_1s | 1 | | Is_on |
| MC5_1s | 1 | | Is_on |
| MC4_1s | 1 | | Is_on |
| MC3_1u | 1 | | Is_on |
| MC2_1u | 1 | | Is_on |
| MC1_1u | 1 | | Is_on |
| MC0_1u | 1 | | Is_on |
| | | | |
| MC7_4s | 0→1 | Iset | |
| MC6_4s | 0→1 | Iset | |
| MC5_4s | 0→1 | Iset | |
| MC4_4s | 0→1 | Iset | |
| MC3_4u | 0 | | Is_off |
| MC2_4u | 0 | | Is_off |
| MC1_4u | 0 | | Is_off |
| MC0_4u | 0 | | Is_off |
| | | | |
| MC7_5s | 1 | | Is_on |
| MC6_5s | 1 | | Is_on |
| MC5_5s | 1 | | Is_on |
| MC4_5s | 1 | | Is_on |
| MC3_5u | 1 | | Is_on |
| MC2_5u | 1 | | Is_on |
| MC1_5u | 1 | | Is_on |
| MC0_5u | 1 | | Is_on |

Fig. 6B

| Cell | State | Iprog | Is |
|---|---|---|---|
| MC7_0s | 1 | | Is_on |
| MC6_0s | 1 | | Is_on |
| MC5_0s | 1 | | Is_on |
| MC4_0s | 1 | | Is_on |
| MC3_0u | 0 | | Is_off |
| MC2_0u | 0 | | Is_off |
| MC1_0u | 0 | | Is_off |
| MC0_0u | 0 | | Is_off |
| | | | |
| MC7_1s | 1→0 | Ireset | |
| MC6_1s | 1→0 | Ireset | |
| MC5_1s | 1→0 | Ireset | |
| MC4_1s | 1→0 | Ireset | |
| MC3_1u | 1 | | Is_on |
| MC2_1u | 1 | | Is_on |
| MC1_1u | 1 | | Is_on |
| MC0_1u | 1 | | Is_on |
| | | | |
| MC7_4s | 1 | | Is_on |
| MC6_4s | 1 | | Is_on |
| MC5_4s | 1 | | Is_on |
| MC4_4s | 1 | | Is_on |
| MC3_4u | 0 | | Is_off |
| MC2_4u | 0 | | Is_off |
| MC1_4u | 0 | | Is_off |
| MC0_4u | 0 | | Is_off |
| | | | |
| MC7_5s | 1→0 | Ireset | |
| MC6_5s | 1→0 | Ireset | |
| MC5_5s | 1→0 | Ireset | |
| MC4_5s | 1→0 | Ireset | |
| MC3_5u | 1 | | Is_on |
| MC2_5u | 1 | | Is_on |
| MC1_5u | 1 | | Is_on |
| MC0_5u | 1 | | Is_on |

Fig. 7A

| Cell | State | Iprog | Is |
|---|---|---|---|
| MC7_0s | 0 | | Is_off |
| MC6_0s | 0 | | Is_off |
| MC5_0s | 0 | | Is_off |
| MC4_0s | 0 | | Is_off |
| MC3_0u | 0 | | Is_off |
| MC2_0u | 0 | | Is_off |
| MC1_0u | 0 | | Is_off |
| MC0_0u | 0 | | Is_off |
| | | | |
| MC7_1s | 1→0 | Ireset | |
| MC6_1s | 1→0 | Ireset | |
| MC5_1s | 1→0 | Ireset | |
| MC4_1s | 1→0 | Ireset | |
| MC3_1u | 1 | | Is_on |
| MC2_1u | 1 | | Is_on |
| MC1_1u | 1 | | Is_on |
| MC0_1u | 1 | | Is_on |
| | | | |
| MC7_4s | 0 | | Is_off |
| MC6_4s | 0 | | Is_off |
| MC5_4s | 0 | | Is_off |
| MC4_4s | 0 | | Is_off |
| MC3_4u | 0 | | Is_off |
| MC2_4u | 0 | | Is_off |
| MC1_4u | 0 | | Is_off |
| MC0_4u | 0 | | Is_off |
| | | | |
| MC7_5s | 1→0 | Ireset | |
| MC6_5s | 1→0 | Ireset | |
| MC5_5s | 1→0 | Ireset | |
| MC4_5s | 1→0 | Ireset | |
| MC3_5u | 1 | | Is_on |
| MC2_5u | 1 | | Is_on |
| MC1_5u | 1 | | Is_on |
| MC0_5u | 1 | | Is_on |

Fig. 7B

| Cell | State | Iprog | Is |
|---|---|---|---|
| MC7_0s | 0→1 | Iset | |
| MC6_0s | 0→1 | Iset | |
| MC5_0s | 0→1 | Iset | |
| MC4_0s | 0→1 | Iset | |
| MC3_0u | 0 | | Is_off |
| MC2_0u | 0 | | Is_off |
| MC1_0u | 0 | | Is_off |
| MC0_0u | 0 | | Is_off |
| | | | |
| MC7_1s | 0 | | Is_off |
| MC6_1s | 0 | | Is_off |
| MC5_1s | 0 | | Is_off |
| MC4_1s | 0 | | Is_off |
| MC3_1u | 1 | | Is_on |
| MC2_1u | 1 | | Is_on |
| MC1_1u | 1 | | Is_on |
| MC0_1u | 1 | | Is_on |
| | | | |
| MC7_4s | 0→1 | Iset | |
| MC6_4s | 0→1 | Iset | |
| MC5_4s | 0→1 | Iset | |
| MC4_4s | 0→1 | Iset | |
| MC3_4u | 0 | | Is_off |
| MC2_4u | 0 | | Is_off |
| MC1_4u | 0 | | Is_off |
| MC0_4u | 0 | | Is_off |
| | | | |
| MC7_5s | 0 | | Is_off |
| MC6_5s | 0 | | Is_off |
| MC5_5s | 0 | | Is_off |
| MC4_5s | 0 | | Is_off |
| MC3_5u | 1 | | Is_on |
| MC2_5u | 1 | | Is_on |
| MC1_5u | 1 | | Is_on |
| MC0_5u | 1 | | Is_on |

Fig. 8A

| Cell | State | Iprog Is |
|---|---|---|
| MC7_0s | 0 | Is_off |
| MC6_0s | 0 | Is_off |
| MC5_0s | 0 | Is_off |
| MC4_0s | 0 | Is_off |
| MC3_0u | 0 | Is_off |
| MC2_0u | 0 | Is_off |
| MC1_0u | 0 | Is_off |
| MC0_0u | 0 | Is_off |
| | | |
| MC7_1s | 1→0 | Ireset |
| MC6_1s | 1→0 | Ireset |
| MC5_1s | 1 | Is_on |
| MC4_1s | 1 | Is_on |
| MC3_1u | 1 | Is_on |
| MC2_1u | 1 | Is_on |
| MC1_1u | 1 | Is_on |
| MC0_1u | 1 | Is_on |
| | | |
| MC7_4s | 0 | Is_off |
| MC6_4s | 0 | Is_off |
| MC5_4s | 0 | Is_off |
| MC4_4s | 0 | Is_off |
| MC3_4u | 0 | Is_off |
| MC2_4u | 0 | Is_off |
| MC1_4u | 0 | Is_off |
| MC0_4u | 0 | Is_off |
| | | |
| MC7_5s | 1→0 | Ireset |
| MC6_5s | 1→0 | Ireset |
| MC5_5s | 1 | Is_on |
| MC4_5s | 1 | Is_on |
| MC3_5u | 1 | Is_on |
| MC2_5u | 1 | Is_on |
| MC1_5u | 1 | Is_on |
| MC0_5u | 1 | Is_on |

Fig. 8B

| Cell | State | Iprog Is |
|---|---|---|
| MC7_0s | 0 | Is_off |
| MC6_0s | 0 | Is_off |
| MC5_0s | 0 | Is_off |
| MC4_0s | 0 | Is_off |
| MC3_0u | 0 | Is_off |
| MC2_0u | 0 | Is_off |
| MC1_0u | 0 | Is_off |
| MC0_0u | 0 | Is_off |
| | | |
| MC7_1s | 0 | Is_off |
| MC6_1s | 0 | Is_off |
| MC5_1s | 1→0 | Ireset |
| MC4_1s | 1→0 | Ireset |
| MC3_1u | 1 | Is_on |
| MC2_1u | 1 | Is_on |
| MC1_1u | 1 | Is_on |
| MC0_1u | 1 | Is_on |
| | | |
| MC7_4s | 0 | Is_off |
| MC6_4s | 0 | Is_off |
| MC5_4s | 0 | Is_off |
| MC4_4s | 0 | Is_off |
| MC3_4u | 0 | Is_off |
| MC2_4u | 0 | Is_off |
| MC1_4u | 0 | Is_off |
| MC0_4u | 0 | Is_off |
| | | |
| MC7_5s | 0 | Is_off |
| MC6_5s | 0 | Is_off |
| MC5_5s | 1→0 | Ireset |
| MC4_5s | 1→0 | Ireset |
| MC3_5u | 1 | Is_on |
| MC2_5u | 1 | Is_on |
| MC1_5u | 1 | Is_on |
| MC0_5u | 1 | Is_on |

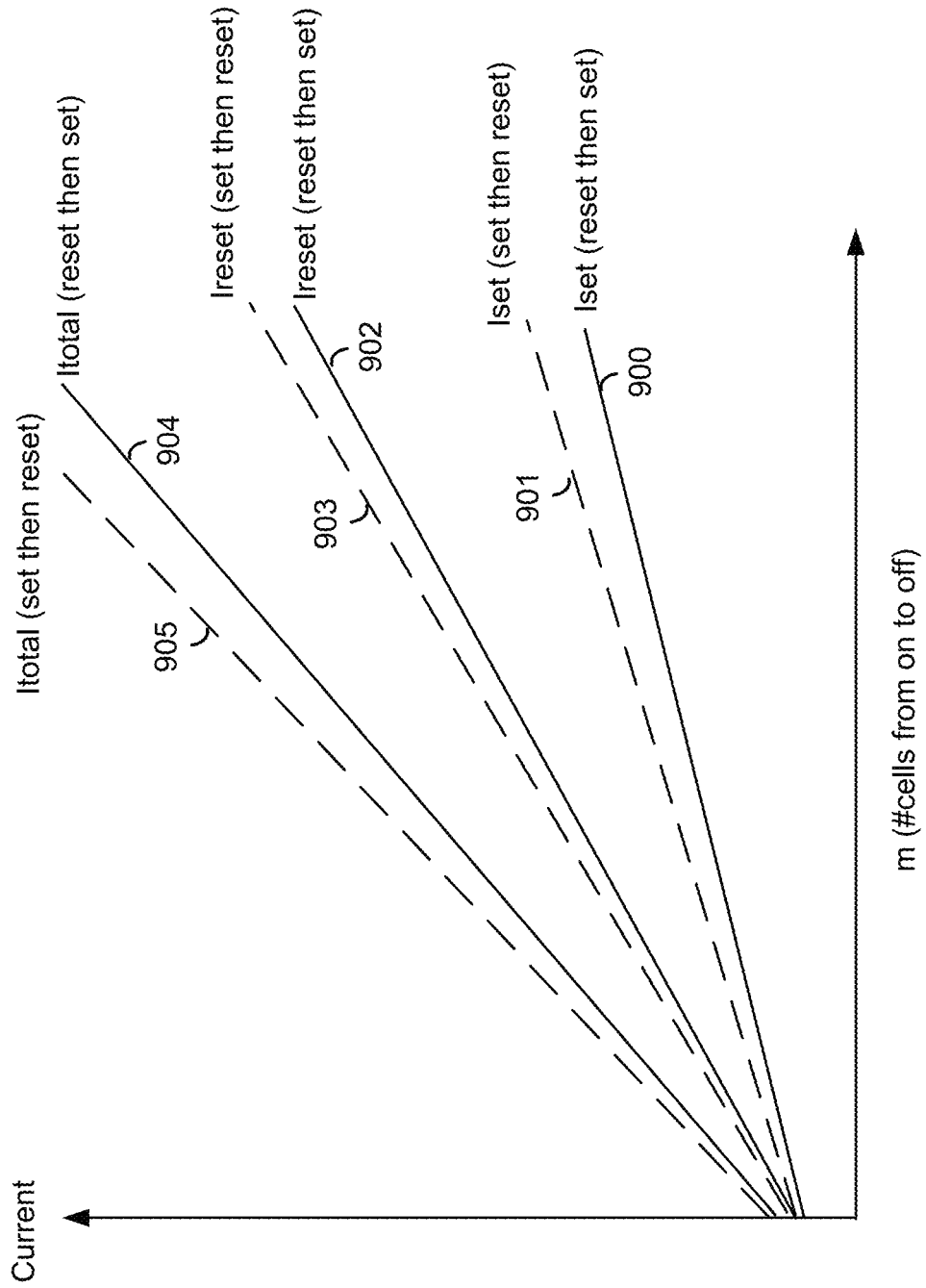

METHODS FOR PROGRAMMING RERAM DEVICES

BACKGROUND

The present technology relates to techniques for programming in a resistance-change memory device.

A variety of materials show reversible resistance-change or resistance-switching behavior in which the resistance of the material is a function of the history of the current through, and/or voltage across, the material. A resistance-switching element comprising one of these materials may be formed in an initial state, for example, a relatively low-resistance state. Upon application of sufficient voltage, the material switches to a stable high-resistance state which is maintained even after the voltage is removed. This resistance switching is reversible such that subsequent application of an appropriate current or voltage switches the resistance-switching element to a stable low-resistance state which is maintained even after the voltage or current is removed. This conversion can be repeated many times. For some materials, the initial state is high-resistance rather than low-resistance. A set process may refer to switching the material from high to low resistance, while a reset process may refer to switching the material from low to high resistance. A resistance-switching memory cell can include a resistance-switching element positioned between first and second electrodes.

Reversible resistance-change materials, also referred to as read-write (RW) materials, are of interest for use in nonvolatile memory arrays. One resistance state may correspond to a data "0," for example, while the other resistance state corresponds to a data "1." Some of these materials may have more than two stable resistance states.

However, there is a continuing need to advance the development of resistance-change memory devices.

BRIEF DESCRIPTION OF THE DRAWINGS

Like-numbered elements refer to common components in the different figures.

FIG. 4 is a graph depicting I-V characteristics of an example bipolar resistance-switching material which sets using a positive voltage.

FIG. 6A depicts a table showing current consumption for the set of memory cells 350 of FIG. 3B in a programming operation which includes a set process in one programming phase followed by a reset process in another programming phase, where the current consumption is for the set process.

FIG. 6B depicts a table showing current consumption for a reset process which follows the set process of FIG. 6A.

FIG. 7A depicts a table showing current consumption for the set of memory cells 350 of FIG. 3B in a programming operation consistent with FIG. 5B which includes a reset process in one programming phase followed by a set process in another programming phase, where the current consumption is for the reset process.

FIG. 7B depicts a table showing current consumption for a set process which follows the reset process of FIG. 7A.

FIG. 8A depicts a table showing current consumption for the set of memory cells 350 of FIG. 3B in a programming operation consistent with FIG. 5B which includes a reset process in two programming phases followed by a set process in another programming phase, where the current consumption is for the reset process in a first programming phase.

FIG. 8B depicts a table showing current consumption for a reset process in a second programming phase which follows the reset process in the first programming phase of FIG. 8A.

FIG. 9 depicts current consumption for a set-then-reset programming operation consistent with FIGS. 6A and 6B compared to current consumption for a reset-then-set programming operation consistent with of FIGS. 7A and 7B.

DETAILED DESCRIPTION

Figure 1:
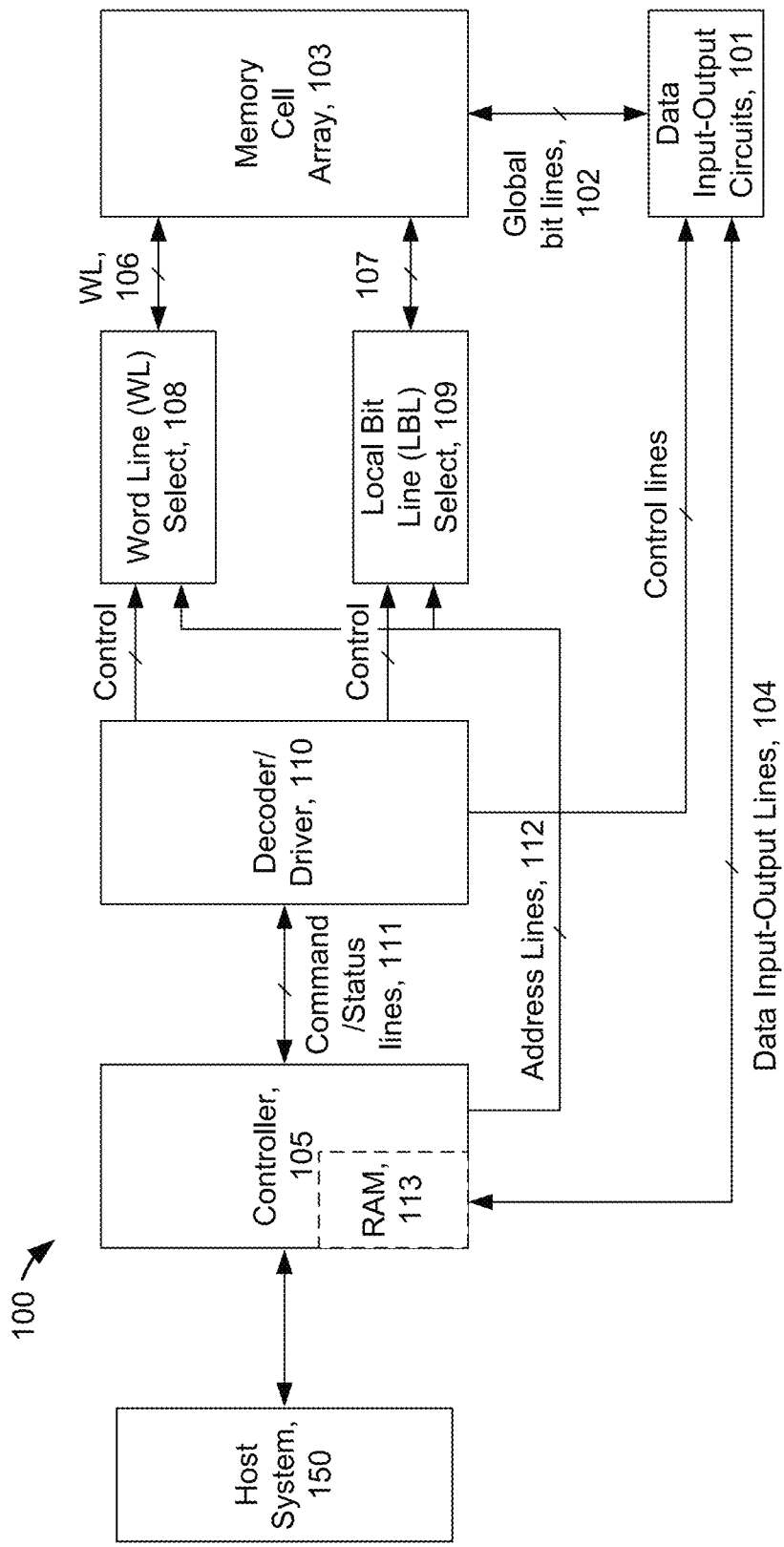
FIG. 1 is a block diagram of a re-programmable non-volatile memory device connected to a host system.

The present technology relates to techniques for programming in a resistance-change memory device and, in particular, to minimizing leakage currents in resistance-change memory cells.

Resistive RAM (ReRAM) based memories suffer from parasitic leakage currents-mainly during programming. Leakage currents, also referred to as sneak currents, are unwanted currents which flow through memory cells which are not currently being programmed while other memory cells are being programmed. Leakage currents occur when a voltage is applied to a conductive path such as a word line which is connected to both the programmed memory cells and the non-programmed memory cells. A high leakage current has a number of negative effects, including increasing power consumption, reducing the accuracy of read operations, and limiting programming rate and the type of programming sequence.

Leakage currents are caused by the resistive nature of the memory cells. During a programming operation, a voltage difference that is provided on a conductive path for programming a selected cell causes unwanted currents over all of the cells which are connected to the conductive path. All of those per-cell leakage currents are combined into a dominant total leakage current referred to as a bias current. Moreover, the total leakage current can be many times larger than the programming current of a cell, e.g., by a factor of about 100-200 in some cases.

Techniques provided herein include programming methods that significantly reduce the bias current for resistive cell based memories.

During a write (program) operation for a set of selected cells in of ReRAM memory, such as a vertical bit line memory, the data pattern of surrounding cells will affect the programmability (e.g., how many cells can be programmed in parallel) and power consumption. Both will impact the write performance. The surrounding cells (e.g., cells not currently being programming) can be in a high or low resistance state. To provide a notation to understand this, assume that the 0 state is a high resistance state, also referred to as an off state, and the 1 state is a low resistance state, also referred to as an on state. A set process is a type of programming which involves a transition from 0 to 1, or off to on, or high resistance to low resistance. A reset process is a type of programming which involves a transition from 1 to 0, or on to off, or low resistance to high resistance. A surrounding cell in the on state will consume more current than a cell in the off state due to the relationship of I=V/R, where I is current, V is voltage and R is resistance. For a given value of V, I is higher when R is lower and I is lower when R is higher. A higher R is thus desirable for the surrounding cells. Therefore, cells in the off state are preferred in the data pattern to optimize power consumption and performance. Techniques provided herein suggest optimizing averaged characteristics of the data pattern of the surrounding cells. In particular, the techniques include reducing the dominant leakage current of ReRAM memories by optimizing the programming sequence.

In one approach, a programming operation involves identifying a first subset of memory cells which are in the low resistance state and which are to be programmed to the high resistance state based on a unit of data, identifying a second subset of memory cells which are in the high resistance state and which are to be programmed to the low resistance state based on the unit of data, and programming the first subset of memory cells before the second subset of memory cells. This is a reset-then-set process. The programming of the first subset of memory cells can occur in one or more phases. In some cases, the number of cells which are programmed together is based on a current limit.

FIG. 1 is a block diagram of a re-programmable non-volatile memory device 100 connected to a host system 150. Data input-output circuits 101 are connected to provide and receive analog electrical signals in parallel over global bit lines (GBLs) 102, also referred to as metal lines herein. The signals represent data stored in addressed memory elements in a memory cell array 103. The data input-output circuits may include sense amplifiers for converting these electrical signals into digital data values during reading. The digital values are then sent over data input-output lines 104 to a controller 105. Conversely, data to be programmed into the memory array is sent by the controller to the data input-output circuits, which program the data into the addressed memory elements by placing appropriate voltages on the global bit lines. For binary operation, one voltage level is typically placed on a global bit line to represent a binary "1" and another voltage level to represent a binary "0". The memory elements are addressed for reading or programming by voltages placed on the word lines (WLLs) 106 and row select lines 107 by respective word line select circuits 108 and local bit line select circuits 109. In an example three-dimensional array, the memory elements between a selected word line and any of the local bit lines connected through select transistors to the global bit lines may be addressed for programming or reading by appropriate voltages being applied through the select circuits 108 and 109. The select transistors may be provided as vertical channel transistors as described further below.

The controller 105 receives data from and sends data to the host system 150. The controller can include a random access memory (RAM) 113 for temporarily storing this data and associated information. Commands, status signals and addresses of data being read or programmed are also exchanged between the controller and the host. The memory device can operate with various host systems such as personal computers (PCs), laptops and other portable computers, cellular telephones, personal digital assistants (PDAs), digital still cameras, digital movie cameras and portable audio players. The host typically connects to the memory device using a built-in receptacle (for receiving a memory card or flash drive that comprises the memory device) or by a wired or wireless path. Alternatively, the memory device may be built into the host system.

The controller conveys commands received from the host to decoder/driver circuits 110 via lines 111. Similarly, status signals are communicated to the controller the from decoder/driver circuits. The decoder/driver circuits 110 can be simple logic circuits, where the controller controls nearly all of the memory operations, or the circuits can include a state machine to control at least some of the repetitive memory operations necessary to carry out given commands. Control signals resulting from decoding commands are applied from the decoder/driver circuits to the word line select circuits 108, local bit line select circuits 109 and data input-output circuits 101. Also connected to the decoder/driver circuits are address lines 112 from the controller that carry physical addresses of memory elements to be accessed within the array 103 in order to carry out a command from the host. The physical addresses correspond to logical addresses received from the host system, where the conversion is made by the controller and/or the decoder/driver circuits. As a result, the local bit line select circuits partially address the designated storage elements within the array by placing appropriate voltages on the control gates of the select transistors to connect selected local bit lines with the global bit lines. The addressing is completed by the decoder/driver circuits applying appropriate voltages to the word lines of the array.

Although each of the memory elements in the memory array may be individually addressed to be programmed or read, it is also possible to program or read sets of memory cells in parallel. For example, one row of memory elements on one plane may be programmed and read in parallel. The number of memory elements programmed or read in parallel depends on the number of memory elements connected to the selected word line. In some arrays, the word lines may be segmented so that only a portion of the total number of memory elements connected along their length may be addressed for parallel operation, namely the memory elements connected to a selected one of the segments. In some arrays, the number of memory elements programmed in one operation may be less than the total number of memory elements connected to the selected word line.

Previously programmed memory elements whose data have become obsolete may be addressed and re-programmed from the states in which they were previously programmed. The starting states can differ among the memory elements being re-programmed in parallel. In some cases, a group of memory elements is reset to a common state before they are re-programmed. For example, the memory elements may be grouped into blocks, where the memory elements of each block are simultaneously reset to a common state, e.g., an erased state, in preparation for subsequently programming them.

The individual blocks of memory elements may be further divided into a plurality of pages of storage elements, wherein the memory elements of a page are programmed or read together.

Figure 2A:
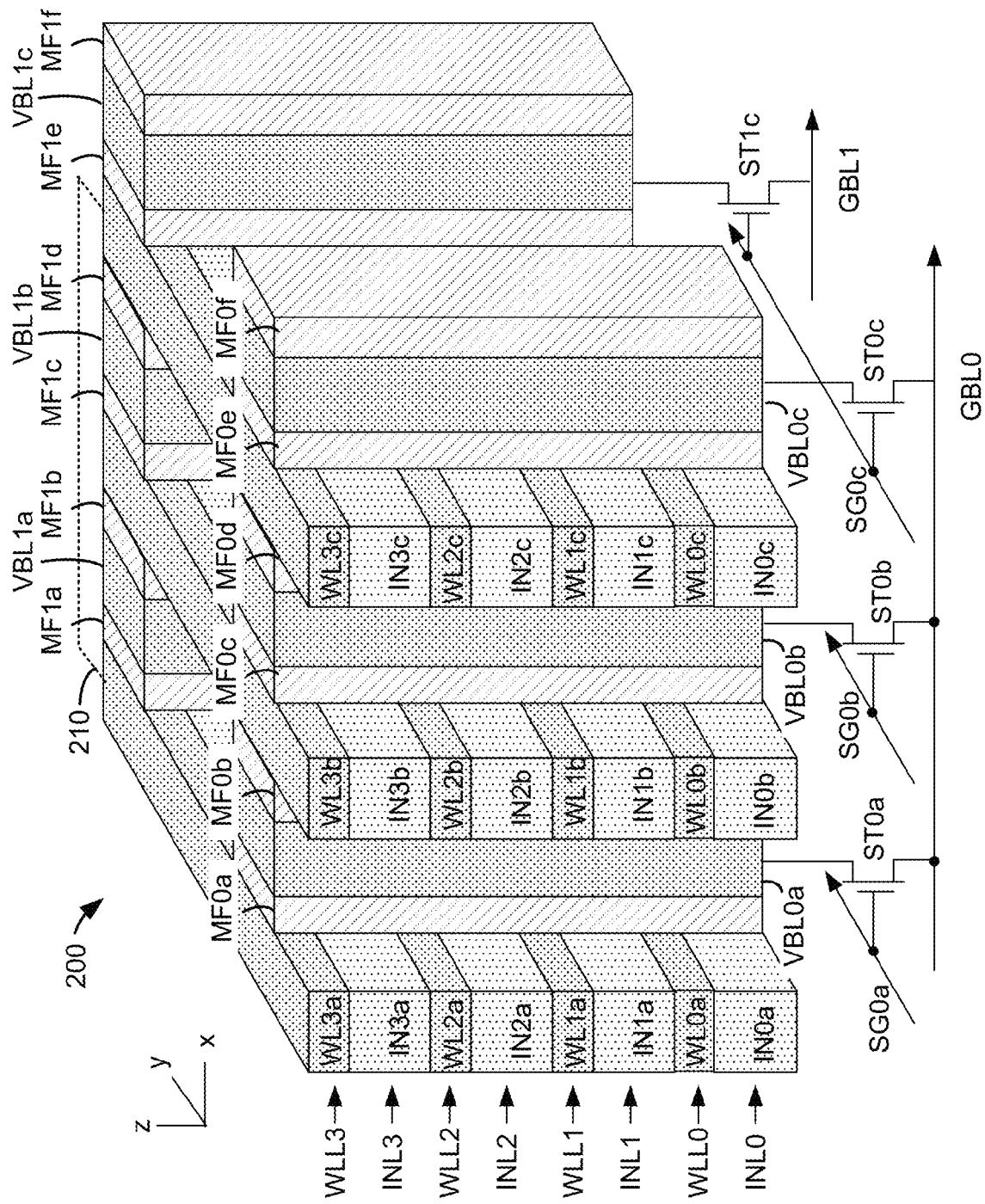
FIG. 2A depicts a three-dimensional array 200 as an example of the memory cell array 103 of FIG. 1.

FIG. 2A depicts a three-dimensional array 200 as an example of the memory cell array 103 of FIG. 1. The array includes stacked and alternating layers of an insulating material (insulation layers INL0, INL1, INL2 and INL3) and a conductive material (word line layers WLL0, WLL1, WLL2 and WLL3). For example, INL0 includes insulation portions IN0a, IN0b and IN0c. WLL0 includes word line portions WL0a, WL0b and WL0c. INL1 includes insulation portions IN1*a*, IN1*b* and IN1*c*. WLL1 includes word line portions WL1*a*, WL1*b* and WL1*c*. INL2 includes insulation portions IN2*a*, IN2*b* and IN12. WLL2 includes word line portions WL2*a*, WL2*b* and WL2*c*. INL3 includes insulation portions IN3*a*, IN3*b* and IN3*c*. WLL3 includes word line portions WL3*a*, WL3*b* and WL3*c*. Memory films are provided between the stacked layers and the vertical bit lines. The memory films include MF0*a* and MF0*b* on either side of a vertical bit line VBL0*a*, MF0*c* and MF0*d* on either side of VBL0*b*, MF0*e* and MF0*f* on either side of VBL0*c*, MF1*a* and MF1*b* on either side of VBL1*a*, MF1*c* and MF1*d* on either side of VBL1*b*, and MF1*e* and MF1*f* on either side of VBL1*c*.

A Cartesian coordinate system indicates a vertical direction (z) and lateral directions x and y. In one approach, for a given word line layer, every other word line portion in the x direction is connected to one another. For example, for WLL3, a path 210 indicates that WL3*a* and WL3*c* are connected via a common conductive path. For WLL2, WL2*a* and WL2*c* are connected. For WLL1, WL1*a* and WL1*c* are connected via a common conductive path. For WLL0, WL0*a* and WL0*c* are connected via a common conductive path. This is consistent with the use of a comb pattern as discussed in connection with FIGS. 3A and 3B.

Each vertical bit line can be selectively connected at its bottom to a global bit line via a select transistor. For example, VBL0*a*, VBL0*b* and VBL0*c* can be connected to GBL0 via a select transistors ST0*a*, ST0*b* and ST0*c*, respectively, which are controlled by select gates SG0*a*, SG0*b* and SG0*c*, respectively. Further, VBL1*c* can be connected to GBL1 via a select transistor ST1*c* (which has the select gate SG0*c*). The select transistors for VBL1*a* and VBL1*b* are not depicted.

Memory cells are formed by regions in which the word lines layers and vertical bit lines intersect.

The memory film can be of various types. Example memory films include chalcogenides, carbon polymers, perovskites, and certain metal oxides (MeOx) and metal nitrides (MeN). Specifically, there are metal oxides and nitrides which include only one metal and exhibit reliable resistance switching behavior. This group includes, for example, Nickel Oxide (NiO), Niobium Oxide (Nb2O5), Titanium Dioxide (TiO2), Hafnium Oxide (HfO2) Aluminum Oxide (Al2O3), Magnesium Oxide (MgOx), Chromium Dioxide (CrO2), Vanadium Oxide (VO), Boron Nitride (BN), and Aluminum Nitride (AlN). The material may be formed in an initial state, for example, a relatively low-resistance state. Upon application of sufficient voltage, the material switches to a stable high-resistance state which is maintained after the voltage is removed. In some cases, the resistance switching is reversible such that subsequent application of an appropriate current or voltage can serve to return the material to a stable low-resistance state which is maintained after the voltage or current is removed. This conversion can be repeated many times. For some materials, the initial state is high-resistance rather than low-resistance. A set process may refer to switching the material from high to low resistance, while a reset process may refer to switching the material from low to high resistance. The set and reset processes can be considered to be programming processes which change the resistance state. In other cases, the resistance switching is irreversible.

The global bit lines may extend in a silicon substrate parallel to one another and directly under the select transistors and vertical bit lines. See FIG. 2B for further details.

Each select transistor may be a pillar shaped Thin Film Transistor (TFT) FET or JFET, for instance. Moreover, a select transistor can have one or two select gates, as discussed below.

Figure 2B:
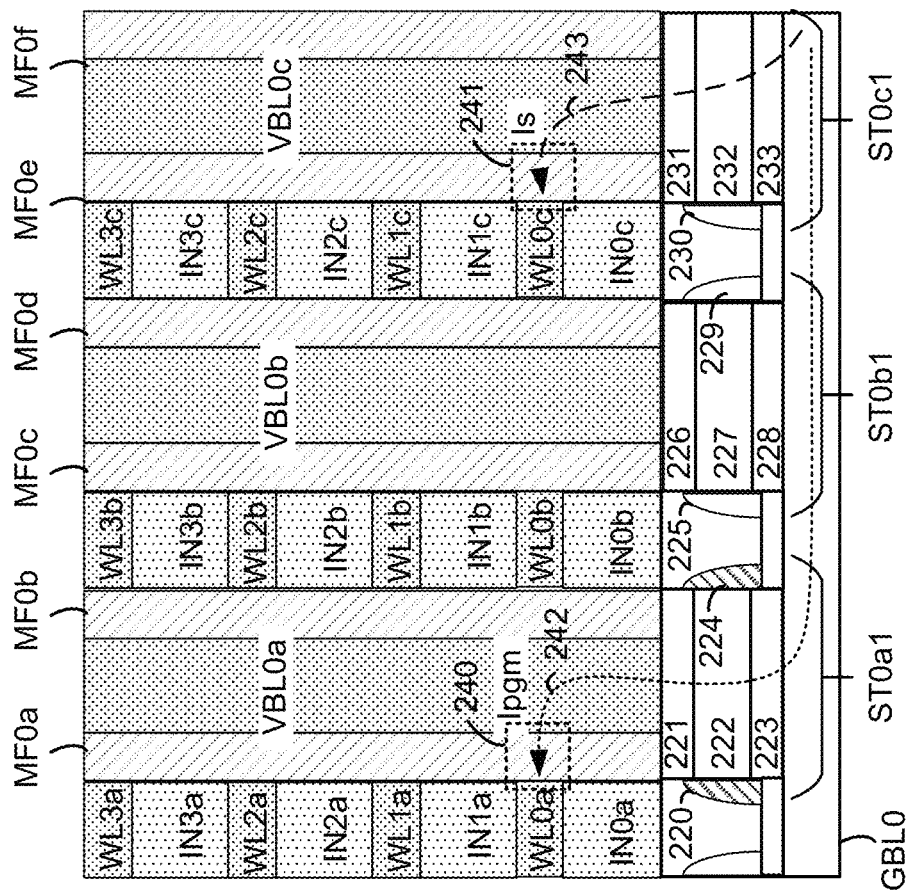
FIG. 2B depicts a cross-sectional view in the x-z plane of FIG. 2A, where split-gate select transistors are provided.

FIG. 2B depicts a cross-sectional view in the x-z plane of FIG. 2A, where split-gate select transistors are provided. The word line portions, memory films and VBLs from FIG. 2A are repeated. The word line portions, memory films and VBLs from FIG. 2A are repeated. The select transistors ST0*a*, ST0*b* and ST0*c* of FIG. 2A are configured as split-gate select transistors ST0*a*1, ST0*b*1 and ST0*a*1, respectively. A split-gate select transistor has two select gates, one on each side of a pillar shaped body. For example, ST0*a*1 has select gates 220 and 224 on either side of a body comprising a source region 221, middle region 222 and drain region 223. ST0*b*1 has select gates 225 and 229 on either side of a body comprising a source region 226, middle region 227 and drain region 228. ST0*c*1 has a select gate 230 and another select gate, not shown, on either side of a body comprising a source region 231, middle region 232 and drain region 233. Adjacent select gates such as 224 and 225, and 229 and 230, are separated by an insulator.

The select gate may be spaced apart from the body by a gate insulator material, not shown. The body and select gate can be polysilicon, for instance. In one possible approach, the source and drain regions are p+ type and the middle region is intrinsic. In another possible approach, the source and drain regions are n+ type and the middle region is p− type. Other variations are possible. When a sufficient voltage is applied to the select gates of a transistor (as indicated by the diagonal line pattern of the select gates 220 and 224), the transistor transitions from a non-conductive state to a conductive state and a conductive path is formed in the body to allow a programming current Ipgm to flow in a path 242 between VBL0*a* and GBL0. In this example, a memory cell 240 adjacent to WL0*a* is selected for programming via VBL0*a*. The current is provided due to a voltage difference between the GBL and WL0*a*. The voltage applied to WL0*s* is also applied to WL0*c* in this example due to a connection between them, as discussed. As a result, there is a potential for a sneak current (Is) in a path 243 from the GBL to a memory cell 241 which is adjacent to WL0*c*. This is the sneak current of the memory cell. This current can exist even if ST0*c*1 is supposed to be in the non-conductive state due to leakage of the transistor. The memory cell 241 is considered to be half-selected.

A split-gate approach allows each transistor to be controlled separately. One option to the split-gate transistor is the shared-gate select transistor. Other select devices could be used as well. Moreover, note that other memory configurations besides the VBL configuration can be used. Generally, any type of memory device can have a leakage current through cells which are not currently being programmed when these cells are connected to a same conductive path as cells which are currently being programmed, such that all of the cells are subject to a same bias on the conductive path.

The vertical bit lines (e.g., VBL0*b*) and unselected word line layer portions (e.g., WL1*a* to WL3*a*, WL0*b* to WL3*b* and WL1*c* to WL3*c*) which are not used for programming can be floated or set to another level so that the associated memory cells are not susceptible to significant leakage current.

Figure 3A:
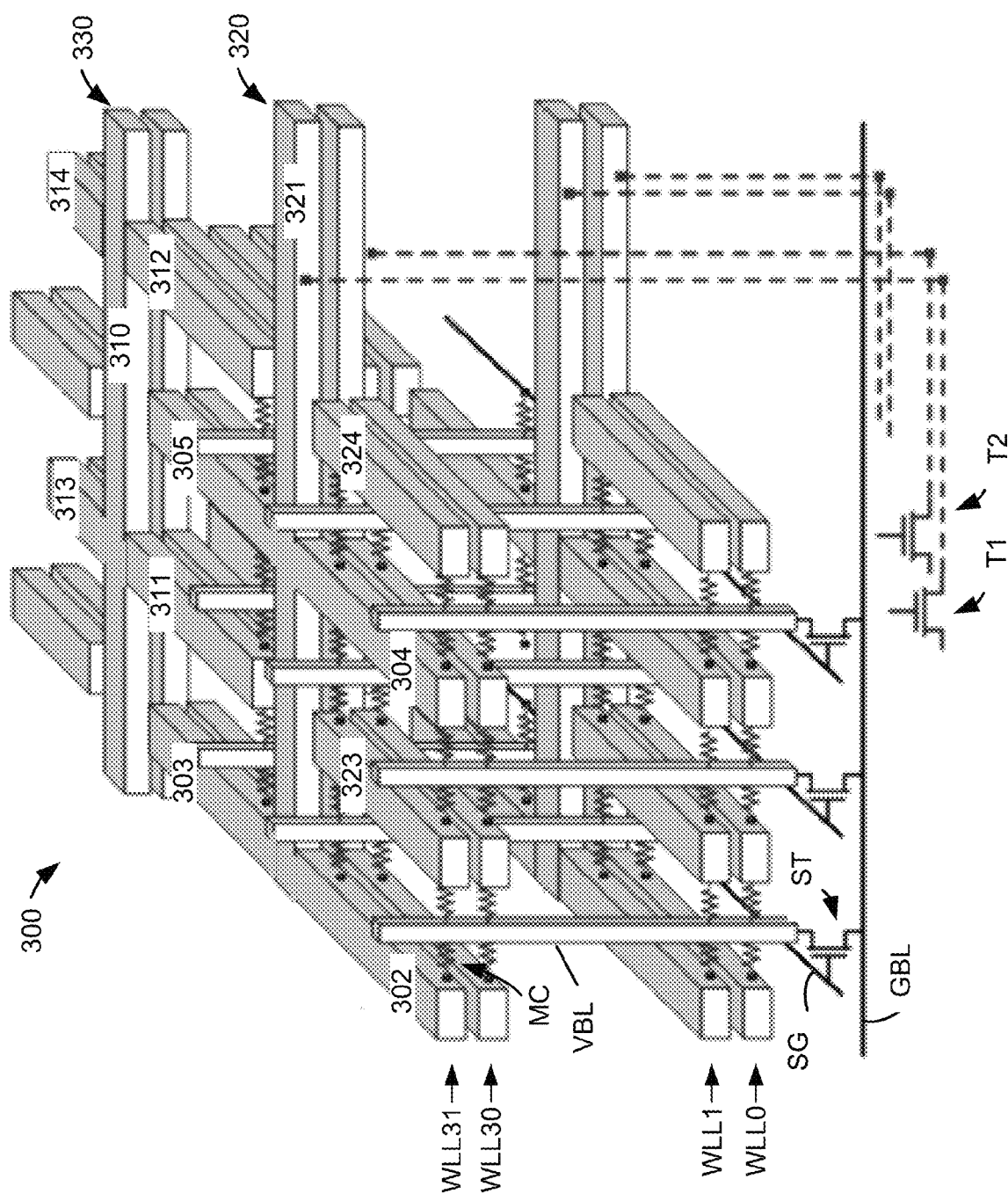
FIG. 3A depicts a three-dimensional memory array 300 as another example of the memory cell array 103 of FIG. 1, where comb shaped word line portions are used.

FIG. 3A depicts a three-dimensional memory array 300 as another example of the memory cell array 103 of FIG. 1, where comb shaped word line portions are used. In this example, there are 32 word line layers, WLL0 to WLL31. Further, each word line layer includes multiple combs. For example, at WLL31, a comb 320 includes a central portion 321, lateral portions 302 and 304 (or fingers) on one side, and lateral portions 303 and 305 on the other side. A comb 330 includes a central portion 310, lateral portions 311 and 312 on one side, and lateral portions 313 and 314 on the other side. Lateral portions 323 and 324 extend from a central portion 341 of another comb 340 (see FIG. 3B) which is not shown in full. Memory cells (MC) are represented as resistors which extend between a vertical bit line (VBL) and a word line portion. An example select transistor (ST), select gate (SG) and global bit line (GBL) are also depicted. Additional example transistors T1 and T2 are provided between a voltage source and the word line portions. These transistors are used to provide a bias on a comb. As mentioned, select transistors are used to provide a bias on one or more VBLs. The difference between the bias on the comb and the bias on the VBL is a programming or read voltage.

The word line portions therefore extend like fingers of a comb. Further, the fingers of different combs are interdigitated. As a result, during a programming operation, a voltage can be applied to one comb but not to another, if desired. Other configurations are possible as well which do not include a comb layout. A comb is a conductive path connected to a set of cells.

Figure 3B:
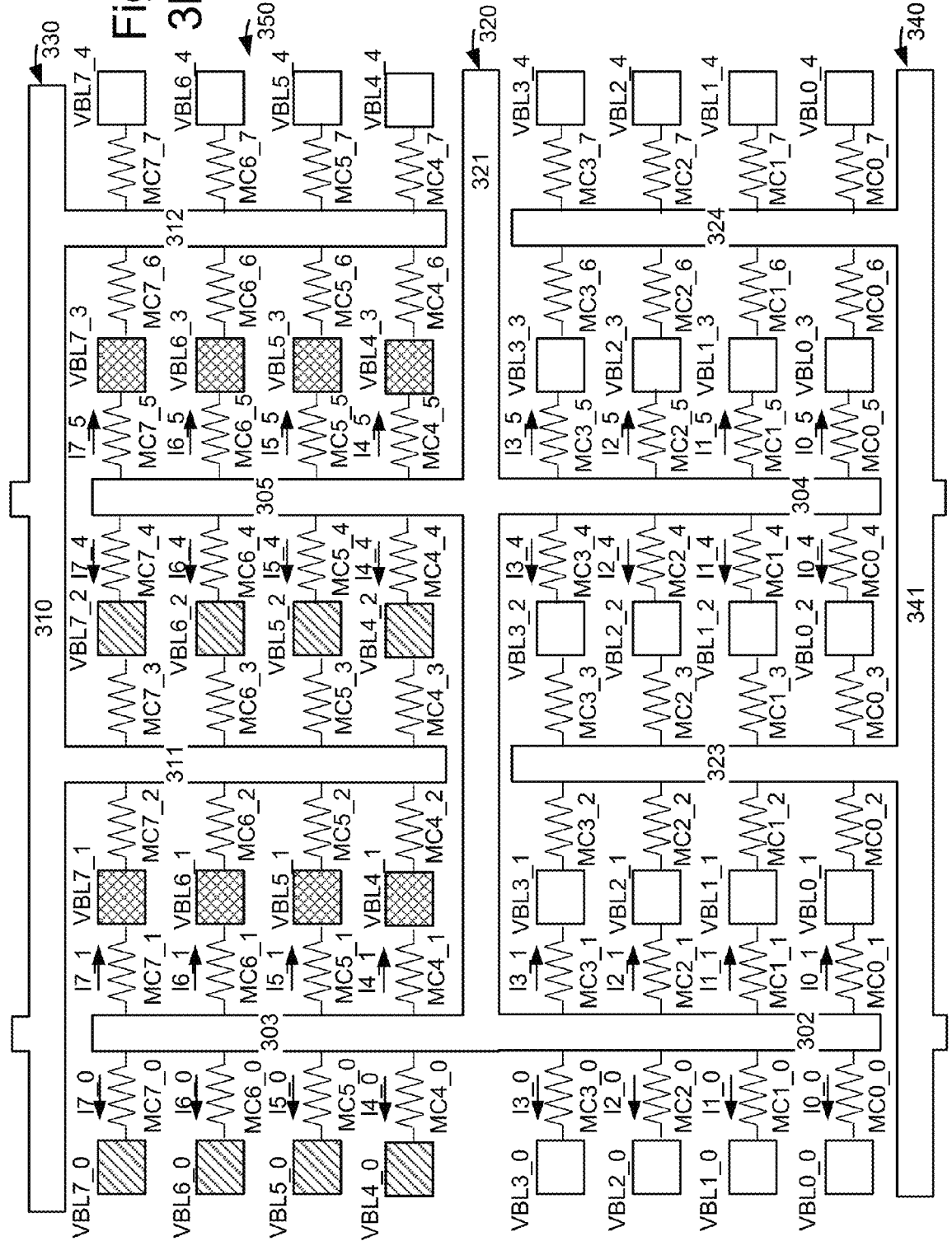
FIG. 3B depicts a set of memory cells 350 consistent with WLL31 of the three-dimensional memory array 300 of FIG. 3A.

FIG. 3B depicts a set of memory cells 350 consistent with WLL31 of the three-dimensional memory array 300 of FIG. 3A. Each cell is controlled by one of three different combs 320, 330 and 340. Each comb is a common conductive path for a respective portion of the cells. The comb 330 includes central portion 310 and lateral portions 311 and 312. The comb 320 includes central portion 321 and lateral portions 302, 303, 304 and 305. The comb 341 includes central portion 341 and lateral portions 323 and 324. The vertical bit lines are depicted as squares and the memory cells are depicted as resistors. The VBLs are labelled as VBL0_0 to VBL7_0, VBL0_1 to VBL7_1, VBL0_2 to VBL7_2, VBL0_3 to VBL7_3 and VBL0_4 to VBL7_4.

A current flowing through the memory cells which are controlled by the comb 320 is depicted by arrows. The memory cells are: MC0_0 to MC7_0, MC0_1 to MC7_1, MC0_4 to MC7_4 and MC0_5 to MC7_5. These cells can include a mixture of selected and unselected cells, in one example where the comb 320 is a selected to write data.

The memory cells which are connected to the comb 330 are: MC4_2 to MC7_2, MC4_3 to MC7_3, MC4_6 to MC7_6 and MC4_7 to MC7_7. These cells include unselected cells in an example where the comb 330 is a not selected to write data.

The memory cells which are connected to the comb 340 are: MC0_2 to MC3_2, MC0_3 to MC3_3, MC0_6 to MC3_6 and MC0_7 to MC3_7. These cells include unselected cells in an example where the comb 340 is a not selected to write data.

In examples discussed further below (FIGS. 5B, 5C, 6A to 8B), the memory cells MC4_0 to MC7_0 and MC4_4 to MC7_4 are selected to be set (transition from Rhigh to Rlow) and MC4_1 to MC7_1 and MC4_5 to MC7_5 are selected to be reset (transition from Rlow to Rhigh). MC4_1 to MC7_1 and MC4_5 to MC7_5 are thus in a first subset of memory cells in the low resistance state which are to be programmed into the high resistance state, and MC4_0 to MC7_0 and MC4_4 to MC7_4 are in a second subset of memory cells in the high resistance state which are to be programmed into the low resistance state.

During the set process, biases are applied to the comb 320 and to VBL4_0 to VBL7_0 and VBL4_2 to VBL7_2, which are distinguished by a diagonal line pattern. The programming voltage for the set process is the difference between these biases. During the reset process, biases are applied to the comb 320 and to VBL4_1 to VBL7_1, and VBL4_3 to VBL7_3 which are distinguished by a cross hatched pattern. The programming voltage for the reset process is the difference between these biases. In one option, a bias of the remaining VBLs is allowed to float or is set at a level which prevents programming, during the set and reset processes.

In this example, a programming operation stores a unit of data using all of the cells which are connected to one conductive path such as the comb 320. However, it is also possible for a programming operation to store a unit of data using fewer than all of the cells which are connected to one conductive path, or using cells which are connected to multiple conductive paths.

FIG. 4 is a graph depicting I-V characteristics of an example bipolar resistance-switching material which sets using a positive voltage. As mentioned, a memory cell can be programmed to store data in a high resistance state (having a resistance Rhigh, which is relatively higher than a resistance Rlow of a low resistance state) or a low resistance state (having a resistance of Rlow which relatively lower than Rhigh). A programming operation can involve applying a voltage across a memory cell which results in a current through the memory cell. One example of a memory cell uses a bipolar resistance-switching material which sets using a positive voltage.

In this case, the set process (a transition from Rhigh to Rlow) occurs when a positive voltage is applied, and the reset process (a transition from Rlow to Rhigh) occurs when a negative voltage is applied. Line 402 represents the I-V characteristic when in the high-resistivity (Rhigh) state and line 400 represents a transition to the low-resistivity (Rlow) state. Line 401 represents the set process and line 403 represents the reset process.

A read voltage Vread is also depicted. To determine the state of the resistance-switching material, Vread is applied across the resistance-switching material while the resulting current is measured and compared to a reference or trip current Iread. A higher or lower measured current (Ion or Ioff, respectively) indicates that the resistance-switching material is in the low or high resistance state, respectively. For example, if Ioff<Iread is measured, the material is in the high resistance state. If Ion>Iread is measured, the material is in the low resistance state. A forming voltage Vf is also depicted. The state of a memory cell may be determined in connection with a programming operation to determine if the state is consistent with write data in which case the cell is not programmed, or if the state is inconsistent with write data in which case the cell is programmed (see step 501 of FIG. 5A).

A current limit Iset_limit for a current through the memory cell can be enforced during a set process.

Alternatively, the memory cell has a bipolar resistance-switching material which sets using a negative voltage. In another possible option, the memory cell has a unipolar resistance-switching material.

Figure 5D:
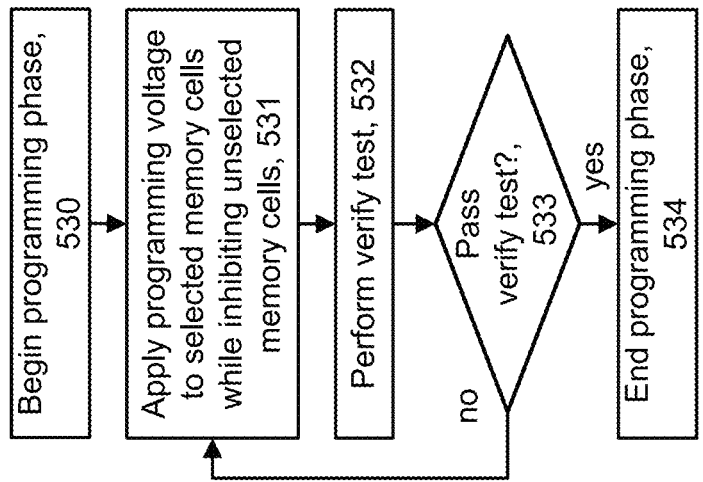
FIG. 5D depicts an example programming phase consistent with FIGS. 5B and 5C.
Figure 5B:
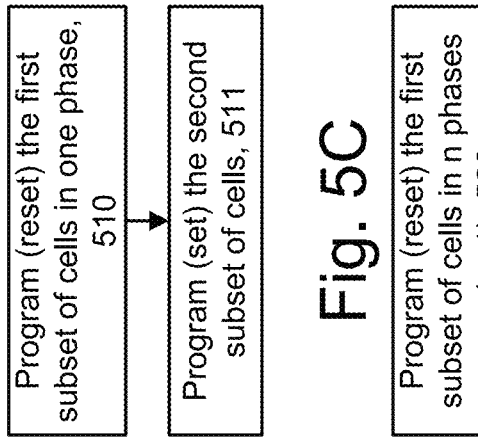
FIG. 5B depicts an example process for performing step 504 of FIG. 5A.
Figure 5C:
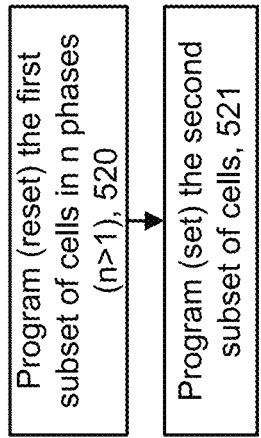
FIG. 5C depicts another example process for performing step 504 of FIG. 5A.
Figure 5A:
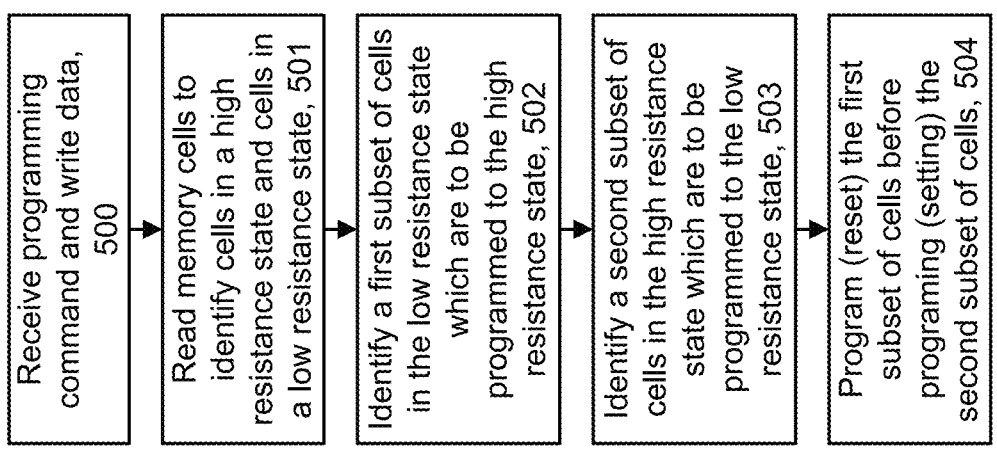
FIG. 5A depicts a process for programming data in a set of memory cells.

FIG. 5A depicts a process for programming data in a set of memory cells. Step 500 includes receiving a programming command and a unit of write data, such as a page of data which is to be written into a set of memory cells. Step 501 includes reading the memory cells to identify cells in a high resistance state and cells in a low resistance state. For example, circuits for reading were discussed in connection with FIG. 1 and a reading process was discussed in connection with FIG. 4.

Step 502 includes identifying a first subset of cells among the cells in the low resistance state which are to be programmed into the high resistance state. For example, the circuitry of FIG. 1 such as the controller can compare a sequence of bits of the write data to a current sequence of bits in the memory cells. For instance, a sequence of the memory cells associated with comb 350 of FIG. 3B: MC0_0 to MC7_0, MC0_1 to MC7_1, MC0_4 to MC7_4, and MC0_5 to MC7_5 may store a bit sequence of: 00000000 11111111 00000000 11111111, and the sequence of write data (a unit of data) may be 00001111 11110000 00001111 11110000. This unit of data is four bytes or 32 bits. A comparison of these two sequences indicates that MC4_1 to MC7_1 and MC4_5 to MC7_5 are to be programmed into the high resistance state. Thus, a memory cell with a 1 which corresponds to a data bit of 0 is to be programmed from 1→0.

Step 503 includes identifying a second subset of cells among the cells in the high resistance state which are to be programmed into the low resistance state. A comparison of the two sequences above indicates that MC4_0 to MC7_0 and MC4_4 to MC7_4 are to be programmed into the low resistance state. Thus, a memory cell with a 0 which corresponds to a data bit of 1 is to be programmed from 0→1.

Step 504 includes programming (resetting) the first subset of cells before programming (setting) the second subset of cells, as described further below. Generally, it is desirable to transition the low resistance cells to a high resistance using the reset process, as soon as possible in a programming operation, to minimize the amount of leakage current.

FIG. 5B depicts an example process for performing step 504 of FIG. 5A. Step 510 includes programming (resetting) the first subset of cells in one phase, e.g., concurrently. Step 511 includes programming (setting) the second subset of cells. This can also occur in one phase so that the second subset of cells are programmed concurrently. Or, the second subset of cells can be programmed in more than one phase such that a first group of the second subset of cells is programmed, then a second group of the second subset of cells is programmed, and so forth, until programming is completed for the second subset of cells.

FIG. 5C depicts another example process for performing step 504 of FIG. 5A. Step 520 includes programming (resetting) the first subset of cells in a number n phases, where n is an integer greater than one. For example, a first group of the first subset of cells is programmed in a first phase, then a second group of the first subset of cells is programmed in a second phase, and so forth, until programming is completed for the first subset of cells.

Thus, the programming of first subset of memory cells can occur in n sequential phases, where n is a number of two or more, and a different portion of the first subset of memory cells is programmed in each of the phases. In one approach, n is set to a relatively high value (n1) when the memory device is in a power saving mode or to a relatively low value (n2) when the memory device is in a program speed optimization mode, where n1>n2 and n2>=1.

In one approach, the different portions can include different numbers of memory cells in the first subset of memory cells.

Another approach includes setting n according to a current limit of the memory device so that an amount of current used in the programming of the first subset of memory cells in each of the phases does not exceed the current limit.

Another approach includes providing a count of a number of memory cells in the first subset of memory cells, wherein n is based on the count.

Step 521 includes programming (setting) the second subset of cells such as discussed in connection with step 511 of FIG. 5B. The programming of the second subset of memory cells can occur in one phase, where all memory cells in the second subset of memory cells are programmed concurrently. Or, the programming of the second subset of memory cells occurs in fewer than n sequential phases.

FIG. 5D depicts an example programming phase consistent with FIGS. 5B and 5C. In one approach, a program operation comprises a number of program-verify iterations. For each iteration, a programming voltage is applied and followed by a verify (read) operation which determines if programming is completed. Other programming approaches are possible as well. A programming phase begins at step 530. Step 531 includes applying a programming voltage to selected memory cells while inhibiting unselected memory cells. For example, as mentioned, a programming voltage can be applied to selected memory cells by applying a bias to the vertical bit lines which are adjacent to the selected memory cells and to the word line portions which are in contact with the set of memory cells. The cells which are not to be programmed in the current phase can be inhibited by applying a suitable bias or allowing the bias to float on the vertical bit lines which are adjacent to these memory cells. A suitable bias for inhibiting a cell may be similar to the bias on the word line portions so that there is no voltage, or only a small voltage which is insufficient for programming, across the unselected memory cells. The cells which are not to be programmed in the current phase can include unselected cells, which are not programmed in any phase of the current programming operation, and selected cells, which are not programmed in the current phase but either have been programmed in an earlier phase of the programming operation, or will be programmed in a subsequent phase of the programming operation.

Step 532 performs a verify test. This can involve, e.g., a read operation such as discussed in connection with FIG. 4. A verify test for a cell which is to be programmed to the low resistance state determines if the cell is in the low resistance state. If the cell is in the low resistance state, programming is completed for this cell and the cell is inhibited from being programmed during any subsequent programming voltage. Similarly, a verify test for a cell which is to be programmed to the high resistance state determines if the cell is in the high resistance state. One cell can be verified at a time, or multiple cells can be verified concurrently.

If the cell is in the high resistance state, programming is completed for this cell and the cell is inhibited from being programmed during any subsequent programming voltage. A decision step 533 determines if the verify test has been passed for the group of cells being programmed. If the verify test has been passed, the programming phase ends at step 534. If the verify test has not been passed, an additional programming voltage is applied at step 531. Generally, the verify test is passed if all, or nearly all, of the cells being programmed have reaches the intended resistance state. In one option, the programming voltage steps up in magnitude for each pass through step 531 in a programming phase, after the first pass.

The examples provided below in FIG. 6A to 8B are based on the set of memory cells of FIG. 3B where MC4_1 to MC7_1 and MC4_5 to MC7_5 are in a first subset of memory cells in the low resistance state which are to be programmed into the high resistance state, and MC4_0 to MC7_0 and MC4_4 to MC7_4 are in a second subset of memory cells in the high resistance state which are to be programmed into the low resistance state.

FIG. 6A depicts a table showing current consumption for the set of memory cells 350 of FIG. 3B in a programming operation which includes a set process in one programming phase followed by a reset process in another programming phase, where the current consumption is for the set process. The programming operation includes two phases. A first phase is the set process and the second phase is the reset process. The cells which are selected to be programmed in the programming operation include the notation "s." These are cells which will be set or reset. The cells which are unselected during the programming operation include the notation "u."

In the table, the first column identifies the memory cell, and the second column identifies the state of the cell. A state of "0→1" indicates the cell is being set in the current programming phase. A state of "1→0" (FIG. 6B) indicates the cell is being reset in the current programming phase. A state of "0" indicates the cell is in the high resistance state and is not set or reset in the current programming phase (this is a cell that is unselected). A state of "1" indicates the cell is in the low resistance state and is not set or reset in the current programming phase (this can be a cell that is unselected, or a cell that is selected to be reset in the second programming phase).

The third column indicates a programming current (Iprog) of the cells. Iprog is either Iset or Ireset. Iset is a current used for setting a cell. Ireset (see FIG. 6B) is a current used for resetting a cell. Generally, Iset>Ireset such as by a factor of two or more. The fourth column indicates a sneak current (Is) of a cell. Is_off is a sneak current of a cell in the off, "0" or high resistance state. Is_on is a sneak current of a cell in the on, "1" or low resistance state. Generally, Is_on>>Is_off such as by a factor of 10-20. In some cases, Is_off can be assumed to be negligible.

Generally, the total current consumption for a program operation is the sum of the current consumptions in the reset and set processes. The current consumption includes a programming current and a leakage current. In general, assume j cells are initially in the on state and m (<j) of these are to be reset to the off state. Also, k cells are initially in the off state and n (<k) of these are to be set to the on state. Ireset is the current used to reset a cell, Iset is the current used to set a cell, Is_on is the leakage current of an on (1) cell and Is_off is the leakage current of an off (0) cell.

In a programming technique in which the set is performed before the reset, the current consumption in the set process is Iset_total=(Iset×n)+(Is_on×j)+(Is_off×(k−n)), and the current consumption in the reset process is Ireset_total=(Ireset×m)+(Is_on×(j+n−m))+(Is_off×(k−n)). In the example of FIGS. 6A and 6B, j=16, m=8, n=8, k=16. Thus, Iset_total=(Iset×8)+(Is_on×16)+(Is_off×8). The total program current is Iset×8. As an example, Iset=2 μA and Iset×8=16 μA. The leakage current is (Is_on×16)+(Is_off×8). If we assume Is_off=0 and Is_on=0.1 μA, the leakage current is 1.6 μA. The total current consumption for the set of cells is 17.6 μA.

FIG. 6B depicts a table showing current consumption for a reset process which follows the set process of FIG. 6A. In a programming technique in which the set is performed before the reset, the current consumption in the reset process is Ireset_total=(Ireset×m)+(Is_on×(j+n−m))+(Is_off×(k−n)). Here, Ireset_total=(Ireset×8)+(Is_on×16)+(Is_off×8). The total program current is Ireset×8. As an example, Ireset=1 μA and Ireset×8=8 μA, which is the same as for the set process of FIG. 6A. The leakage current is (Is_on×16)+(Is_off×8). If we assume Is_off=0 and Is_on=0.1 μA, the leakage current is 1.6 μA, which is the same as for the set process of FIG. 6A. The total current consumption for the reset is 9.6 μA.

FIG. 7A depicts a table showing current consumption for the set of memory cells 350 of FIG. 3B in a programming operation consistent with FIG. 5B which includes a reset process in one programming phase followed by a set process in another programming phase, where the current consumption is for the reset process.

In the programming technique in which the reset is performed before the set, the current consumption in the reset process is Ireset_total=(Ireset×m)+(Is_on×(j−m))+(Is_off×k). In the example of FIGS. 7A and 7B, j=16, m=8, n=8, k=16. Here, Ireset_total=(Ireset×8)+(Is_on×8)+(Is_off×16). The total program current is Ireset×8. With Ireset=1 μA, Ireset×8=8 μA, which is the same as for the reset process of FIG. 6B.

The leakage current is (Is_on×8)+(Is_off×16). With Is_off=0 and Is_on=0.1 μA, the leakage current is 0.8 μA, which is less than the 1.6 μA of the reset process of FIG. 6B. As a result, the leakage current is significantly lower during reset when the reset is performed before the set than when the reset is performed after the set. The total current consumption for the reset is 8.8 μA.

FIG. 7B depicts a table showing current consumption for a set process which follows the reset process of FIG. 7A. In the programming technique in which the reset is performed before the set, the current consumption in the set process is Iset_total=(Iset×n)+(Is_on×(j−m))+(Is_off×(k+m−n)). Here, Iset_total=(Iset×8)+(Is_on×8)+(Is_off×16). The total program current is Iset×8. With Iset=2 μA, Iset×8=16 μA which is the same as for the set process of FIG. 6A. The leakage current is (Is_on×8)+(Is_off×16). With Is_off=0 and Is_on=0.1 μA, the leakage current is 0.8 μA, which is less than the 1.6 μA of the set process of FIG. 6A. As a result, leakage current is significantly lower during set when the set is performed after the reset than when the reset performed before the set. The total current consumption for the set of cells is 16.8 μA.

FIG. 8A depicts a table showing current consumption for the set of memory cells 350 of FIG. 3B in a programming operation consistent with FIG. 5B which includes a reset process in two programming phases followed by a set process in another programming phase, where the current consumption is for the reset process in a first programming phase. A different portion of the first subset of cells is programmed in each phase. For example, one portion comprises MC7_1s, MC6_1s, MC7_5s and MC6_5s, which are reset in this phase. The total program current is Ireset×4. With Ireset=1 μA, Ireset×4=4 μA. The leakage current is (Is_off×16)+(Is_on×12). With Is_off=0 and Is_on=0.1 μA, the leakage current is 1.2 μA which is less than the 1.6 μA of the reset process of FIG. 6B but more than the 0.8 μA of the reset process of FIG. 7A. The total current consumption for the reset in this phase is 5.2 μA.

FIG. 8B depicts a table showing current consumption for a reset process in a second programming phase which follows the reset process in the first programming phase of FIG. 8A. The portion of the first subset of cells which is reset in this phase comprises MC4_1s, MC5_1s, and MC4_5s and MC5_5s. The total program current is Ireset×4. With Ireset=1 μA, Ireset×4=4 μA. The leakage current is (Is_off×20)+(Is_on×8). With Is_off=0 and Is_on=0.1 μA, the leakage current is 0.8 μA which is less than the 1.6 μA of the reset process of FIG. 6B and the same as the 0.8 μA of the reset process of FIG. 7A. After the two reset phases of FIGS. 8A and 8B, a set process can be performed such as described in connection with FIG. 7B. The total current consumption for the reset in this phase is 4.8 μA. The total current consumption for both reset phases is 10 μA.

A multi-phase set process may be performed when the program current is limited to an amount which does not allow setting of all of the cells in one phase.

Note that the examples of FIGS. 3B and 6A to 9B are simplified since the number of cells is small and the proportion of the cells which are programmed in a phase is relatively high. In practice, there can be a much large number of cells, such as thousands of cells, and the number of cells which can be programmed together is typically a small percentage of the total number of cells due to constraints such as the amount of current which can be provided. As a result, the leakage current can significantly exceed the programming current, contrary to the examples of FIG. 6A to 8B.

Leakage current can be modelled using different approaches. One approach assumes the leakage current of a cell is the same when one other cell is being set (or reset) or multiple other cells are being set (or reset). Another approach assumes the leakage current for a cell is higher when programming multiple other cells concurrently. In this case, the leakage current may be a function of the number of cells being set (or reset). In any case, a reset before set consumes less current, and operating in small groups of cells can help in meeting current limitations FIG. 9 depicts current consumption for a set-then-reset programming operation consistent with FIGS. 6A and 6B compared to current consumption for a reset-then-set programming operation consistent with of FIGS. 7A and 7B. The horizontal axis denotes a number m of cells which are to be programmed from on to off (reset) and the vertical axis denotes a current. Line 900 represents Iset when reset is performed before set, consistent with FIG. 7B. Line 901 represents Iset when set is performed before reset, consistent with FIG. 6A.

Line 902 represents Ireset when reset is performed before set, consistent with FIG. 7A. Line 903 represents Ireset when set is performed before reset, consistent with FIG. 6B. Line 904 represents a total current Itotal when reset is performed before set, as the sum of lines 900 and 902. Line 905 represents a total current Itotal when set is performed before reset, as the sum of lines 901 and 903. These results indicate that the total current is lower when reset is performed before set. An assumption is that one half of the cells are on and one half are off before the write operation.

Generally, it is desirable to optimize the programming sequence so that the low resistance (off) cells which are to be programmed to the high resistance state to represent a logical 0 of the high resistance state are programmed earlier, to the extent possible, than the high resistance (on) cells which are to be programmed to the low resistance state to represent a logical 1 of the low resistance state. In other words, according to the notation above, the programming sequence will be such that the logical 0's (high resistance representation)—are first programmed, and the logical 1's (low resistance) are programmed later. Note that the bias current is derived from the leakage current that goes through all cells at the relevant comb. In this way, the average bias current is reduced. This technique assumes the cells are not erased between successive programming operations.

Another embodiment involves dividing the programming sequence of the cells to be reset into n phases, where n>2. An example of this approach was provided in connection with FIGS. 8A and 8B where the reset was provided in n=2 phases. This approach involves determining which of the cells which are to be reset and which are to be set. A group of 1/n of these cells are then reset in a programming phase. This programming is repeated n−1 additional times, once for each successive group of 1/n cells. A lower current is consumed in each phase since a growing portion of the cells are in the high resistance state. After all of the cells to be reset have been programmed, the cells which are to be set are programmed. Optionally, the cells which are to be set can be identified after programming of the cells to be reset. At this point, the maximal number of cells are in the high resistance state so that leakage is minimized during the set process, which can occur in one or more phases.

Another embodiment may be implemented in a case where there is a preset current limit and the programming occurs in phases. In this case, the number of cells which can be programmed in each phase is limited by the current limit. Each phase may include a different number of cells which are in the 0 or 1 state as long as the total current is kept under the current limit. Moreover, the number of steps is not fixed and may depend on the number of cells that need to be reset from 1 to 0 and set from 0 to 1.

For example, assume a set of 1,000 cells is connected to a common conductive path. Further, as before, assume each 1→0 (set) transition consumes 1 μA (Iset), each 0→1 (reset) transition consumes 2 μA (Ireset), each cell which remains at 0 while other cells are programmed does not consume current and each cell which remains at 1 while other cells are programmed consumes 0.1 μA as a leakage current. Further, assume that there are 100 cells at 0 (high resistance), where 50 of these cells are to be set, and 900 cells at 1 (low resistance), where 400 of these cells are to be reset. Assume also that a total current limit is 260 μA in a programming phase. If the programming is completed in one phase, the programming current for resetting 400 cells from 1→0 is 400 μA, the programming current for setting 50 cells from 0→1 is 100 μA, and the leakage current for keeping 500 cells (900−400) at 1 is 50 μA. The total current is 550 μA, which exceeds the limit of 260 μA. This example assumes that a set is performed for some cells concurrently with a reset being performed for other cells. Alternatively, the set is performed in a separate phase from reset.

One alternative approach involves a first programming phase in which 150 cells are reset from 1→0 using a current of 150 μA and 750 cells (900−150) are kept at 1, resulting in a leakage current of 75 μA and a total current of 225 μA, which is less than the limit of 260 μA. In a second programming phase, 200 cells are reset from 1→0 using a current of 200 μA and 550 cells (750−200) at kept at 1, resulting in a leakage current of 55 μA and a total current of 255 μA, which is less than the limit of 260 μA. In a third programming phase, 50 cells are reset from 1→0 using a current of 50 μA, 500 cells (550−50) are kept at 1, resulting in a leakage current of 50 μA, and 50 cells are set from 0→1 using 100 μA, for a total current of 200 μA, which is less than the limit of 260 μA.

Optionally, a different current limit is imposed in the different programming phases.

With the techniques provided herein, it may sometimes be possible to perform the programming operation in fewer phases and therefore save time. That is, with a lower leakage current, a higher programming current can be used so that a larger number of cells can be programmed concurrently while remaining with a total current limit, in a given programming phase. This requires a more detailed analysis of the resources and constraints of the system, and is a beneficial feature whenever available. The embodiment optimizes the number of pulses (or programming phases) to increase the total throughput while maintaining the current limit.

The concepts discussed herein are valid for all resistive-cell based memories.

Note also that the goal of performing the resets before the sets could be combined with other programming sequence restrictions. For example, it is not necessary that all the off cells are programmed first, but they should be programmed as early as possible in view of other considerations.

Accordingly, it can be seen, in one embodiment, a method for programming in a memory device comprises: for each memory cell of a set of memory cells in the memory device, determining whether the memory cell is in a high resistance state or a low resistance state, wherein each memory cell of the set of memory cells is connected to a common conductive path, each memory cell of the set of memory cells is a resistance change memory cell which is able to change its resistance to store information as a function of its resistance, the set of memory cells is arranged in array and each memory cell is subject to a programming voltage on the common conductive path; identifying from the set of memory cells, a first subset of memory cells, the first subset of memory cells comprises memory cells which are in the low resistance state and which are to be programmed to the high resistance state based on a unit of data; identifying from the set of memory cells, a second subset of memory cells, the second subset of memory cells comprises memory cells which are in the high resistance state and which are to be programmed to the low resistance state based on the unit of data; and responsive to the identifying of the first subset of memory cells and the identifying of the second subset of memory cells: programming the first subset of memory cells before the second subset of memory cells.

In another embodiment, a memory device comprises: a set of memory cells; a conductive path connected to the set of memory cells; and a control circuit. The control circuit, to program a unit of data into the set of memory cells: determines, for each memory cell of the set of memory cells, whether the memory cell is in a high resistance state or a low resistance state; identifies from the set of memory cells, a first subset of memory cells, the first subset of memory cells comprises memory cells which are in the low resistance state and which are to be programmed to the high resistance state based on the unit of data; identifies from the set of memory cells, a second subset of memory cells, the second subset of memory cells comprises memory cells which are in the high resistance state and which are to be programmed to the low resistance state based on the unit of data; and programs the first subset of memory cells before the second subset of memory cells.

In another embodiment, a memory device comprises: a set of memory cells; a conductive path connected to the set of memory cells; and a control circuit. The control circuit, to program a unit of data into the set of memory cells: identifies from the set of memory cells, based on the unit of data, a first subset of memory cells which are to be reset and a second subset of memory cells which are to be set, and determines a programming sequence for the unit of data in which a priority with which the first subset of memory cells is programmed is higher than a priority with which the second subset of memory cells is programmed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for programming in a memory device, comprising:
for each memory cell of a set of memory cells in the memory device, determining whether the memory cell is in a high resistance state or a low resistance state, wherein each memory cell of the set of memory cells is connected to a common conductive path, each memory cell of the set of memory cells is a resistance change memory cell which is able to change its resistance to store information as a function of its resistance, the set of memory cells is arranged in array and each memory cell is subject to a programming voltage on the common conductive path;

identifying from the set of memory cells, a first subset of memory cells, the first subset of memory cells comprises memory cells which are in the low resistance state and which are to be programmed to the high resistance state based on a unit of data;
identifying from the set of memory cells, a second subset of memory cells, the second subset of memory cells comprises memory cells which are in the high resistance state and which are to be programmed to the low resistance state based on the unit of data; and
responsive to the identifying of the first subset of memory cells and the identifying of the second subset of memory cells: programming the first subset of memory cells before the second subset of memory cells.

2. The method of claim 1, wherein:
the programming the first subset of memory cells occurs in n sequential phases, where n is a number of two or more, and a different portion of the first subset of memory cells is programmed in each of the n sequential phases.

3. The method of claim 2, wherein:
the different portions include different numbers of memory cells in the first subset of memory cells.

4. The method of claim 2, wherein:
the programming of the second subset of memory cells occurs in one phase of the where all memory cells in the second subset of memory cells are programmed concurrently.

5. The method of claim 2, wherein:
the programming of the second subset of memory cells occurs in fewer than n sequential phases.

6. The method of claim 2, further comprising:
setting n according to a current limit of the memory device so that an amount of current used in the programming of the first subset of memory cells in each of the n sequential phases does not exceed the current limit.

7. The method of claim 2, wherein:
n is set to a relatively high value when the memory device is in a power saving mode or to a relatively low value when the memory device is in a program speed optimization mode.

8. The method of claim 2, wherein:
providing a count of a number of memory cells in the first subset of memory cells, wherein n is based on the count.

9. The method of claim 1, wherein:
the programming the first subset of memory cells occurs in n sequential phases, where n is a number of one or more, and n is set to a relatively high value of two or more when the memory device is in a power saving mode or to a relatively low value when the memory device is in a program speed optimization mode.

10. The method of claim 1, wherein:
for each memory cell of a set of memory cells in the memory device, the determining whether the memory cell is in the high resistance state or the low resistance state comprises reading the memory cell.

11. A memory device, comprising:
a set of memory cells;
a conductive path connected to the set of memory cells; and
a control circuit, the control circuit, to program a unit of data into the set of memory cells is configured to:
determine, for each memory cell of the set of memory cells, whether the memory cell is in a high resistance state or a low resistance state;
identify from the set of memory cells, a first subset of memory cells, the first subset of memory cells comprises memory cells which are in the low resistance state and which are to be programmed to the high resistance state based on the unit of data;
identify from the set of memory cells, a second subset of memory cells, the second subset of memory cells comprises memory cells which are in the high resistance state and which are to be programmed to the low resistance state based on the unit of data; and program the first subset of memory cells before the second subset of memory cells.

12. The memory device of claim 11, wherein:

the control circuit programs the first subset of memory cells in n sequential phases, where n is a number of two or more, and a different portion of the first subset of memory cells is programmed in each of the n sequential phases.

13. The memory device of claim 12, wherein:

the control circuit programs the second subset of memory cells in fewer than n sequential phases.

14. The memory device of claim 12, wherein:

n is set according to a current limit of the memory device so that an amount of current used in the programming of the first subset of memory cells in each of the n sequential phases does not exceed the current limit.

15. The memory device of claim 12, wherein:

n is set to a relatively high value when the memory device is in a power saving mode or to a relatively low value when the memory device is in a program speed optimization mode.

16. The memory device of claim 11, wherein:

for each memory cell of a set of memory cells in the memory device, the control circuit reads the memory cell to determine whether the memory cell is in the high resistance state or the low resistance state.

* * * * *